(12) United States Patent
Brox et al.

(10) Patent No.: US 6,765,421 B2
(45) Date of Patent: Jul. 20, 2004

(54) DUTY-CYCLE CORRECTION CIRCUIT

(75) Inventors: Martin Brox, Munich (DE); Alessandro Minzoni, Munich (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/393,525

(22) Filed: Mar. 20, 2003

(65) Prior Publication Data

US 2004/0027182 A1 Feb. 12, 2004

(51) Int. Cl.[7] .............................................. H03K 3/017
(52) U.S. Cl. ...................................... 327/175; 327/161
(58) Field of Search .......................... 327/170, 172–175, 327/149, 153, 158, 161

(56) References Cited

U.S. PATENT DOCUMENTS

| | | | | |
|---|---|---|---|---|
| 5,631,591 A | * | 5/1997 | Bar-Niv | 327/158 |
| 6,326,827 B1 | | 12/2001 | Cretti et al. | 327/175 |
| 6,470,060 B1 | * | 10/2002 | Harrison | 375/374 |
| 6,539,072 B1 | * | 3/2003 | Donnelly et al. | 375/371 |
| 6,642,760 B1 | * | 11/2003 | Alon et al. | 327/158 |
| 6,677,792 B2 | * | 1/2004 | Kwak | 327/158 |

* cited by examiner

Primary Examiner—Timothy P. Callahan
Assistant Examiner—Cassandra Cox
(74) Attorney, Agent, or Firm—Fish & Richardson P.C.

(57) ABSTRACT

An apparatus for generating two signals having a predetermined spacing between mutually corresponding signal edges includes first and second delay devices for delaying a clock signal and a complementary clock signal in response to respective first and second control signals. A first control signal generator generates the first control signal on the basis of the clock signal and the delayed clock signal. A second control signal generator generates the second control signal on the basis of the delayed clock signal and the delayed complementary clock signal. The second control signal generator causes the delayed clock signal and the delayed complementary clock signal to have a steady-state condition in which mutually corresponding edges thereof are separated by a pre-determined spacing.

21 Claims, 7 Drawing Sheets

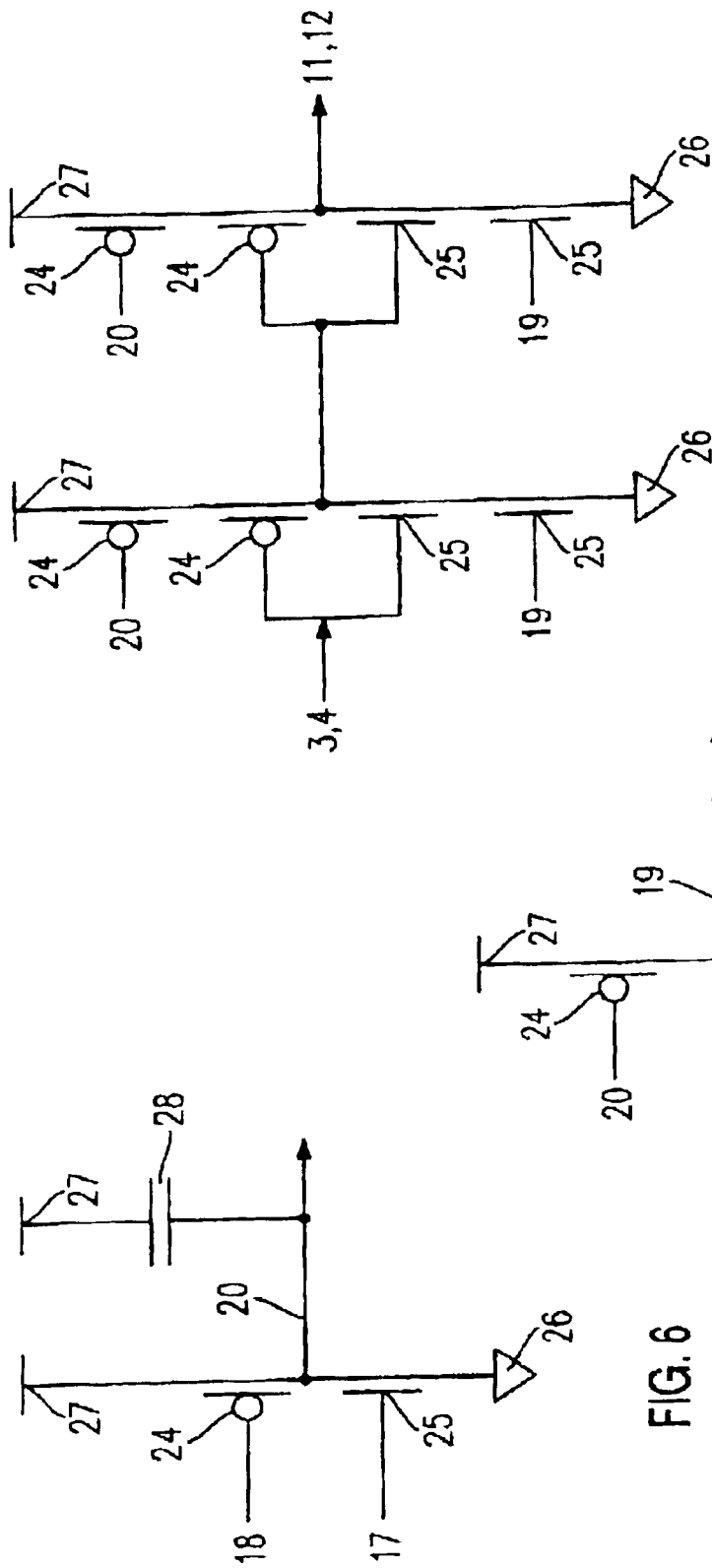

DUTY-CYCLE CORRECTION CIRCUIT

FIELD OF INVENTION

The present invention relates to a method and an apparatus for generating two signals with a pre-determined spacing between mutually corresponding signal edges.

RELATED APPLICATIONS

This application claims the benefit of the Mar. 28, 2002 priority date of German application DE 102.14.304.8-53, the contents of which are herein incorporated by reference.

BACKGROUND

Semiconductor devices, such as, for example, DRAM memory devices or other microelectronic apparatuses, are generally provided with delay locked loops (DLLs) in order to synchronize the data output with an external clock signal, or bring them in phase with one another.

In the so-called double data rate scheme, a data bit is driven with the rising clock edge and a data bit is driven with the falling clock edge. If the duty ratio (duty cycle) is assumed to be 0.5, i.e. the HIGH level of the clock signal has the same length as the LOW level of the clock signal, the maximum bit duration amounts to half of the clock period in the double data rate scheme (DDR). However, the clock typically does not have a precise duty ratio of 50%. If the data are then simply driven by the edges, this leads to a shift in the length of the bit duration, i.e. the period of time in which the data are valid.

In order to improve the uniformity of the bit duration, duty ratio correction circuits have been proposed in the past. The aim of a duty ratio correction circuit is to provide a clock on a chip with a duty ratio of 0.5 even if an imprecise external clock signal having a duty ratio that deviates from this is present. However, the previously known methods are difficult to implement and consume a large amount of current, such as e.g. in a DLL with a differential current mode in which the crossover point of the internal clocks is shifted by adding an analog current onto for example the true, but not the complementary, clock path.

An architecture that is already used in delay locked loops (DLLs) has two delay lines in order to eliminate the sensitivity to propagation delay differences between the rising and falling clock edges. FIG. 5 illustrates such an architecture having two delay devices 5 (delay lines). Two receivers 22A, 22B, which are connected in a complementary manner to a true clock signal 1 and a complementary clock signal 2, are provided in this arrangement. The receivers generate a clock signal 3 and a clock signal 4 complementary thereto, which run through identically controlled delay devices 5 (delay lines). After passing though a driver stage 23, a delayed internal clock signal 11 and an inverted delayed clock signal 12 are present. The delayed internal clock signal 11 is fed via a feedback 8, which inevitably has a certain delay (feedback delay), in the form of a delayed signal 21 to a phase detector 7, which compares the phase of the delayed signal 21 with the phase of the clock signal 3 and accordingly forwards a control signal 17 (FASTER) or a control signal 18 (bSLOWER) to a conventional pump device 6 (charge pump). A control signal 19, 20 is provided in the pump device 6 (charge pump), by means of which control signal the two delay devices 5 (delay lines) are controlled virtually in parallel.

FIG. 6 shows part of a conventional pump device 6 (charge pump) in a diagrammatic illustration, in which the control signal 17 (FASTER) serves to drive an n-channel field-effect transistor 25, the control signal 18 (bSLOWER) driving a p-channel field-effect transistor 24. A control signal 20, e.g. a voltage level, is realized by charging or discharging a capacitor 28 by means of the switching devices 24, 25, which, according to the control signals 17, 18, connects a voltage source 27 or ground 26 to one terminal of the capacitor 28, while the supply voltage 27 is applied to the other terminal.

FIG. 7 shows a current mirror, which is likewise part of the conventional pump device 6 (charge pump) for generating a control signal 19 from the control signal 20. To that end, the control signal 20 is fed to the drive terminal of a p-channel field-effect transistor 24, which can connect a supply voltage source 27 to one terminal of a capacitor 28 for the purpose of charging that capacitor 28, the other terminal of the capacitor 28 being connected to ground 26. The voltage across the capacitor corresponds to the control signal 19, which is fed to the drive terminal of an n-channel field-effect transistor 25 in order to be able to discharge the capacitor 28.

FIG. 8 represents the diagrammatic illustration of a delay device 5 (delay line), in which an input signal 29 is fed in parallel to a p-channel field-effect transistor 24 and to an n-channel field-effect transistor 25. The forwarding of the signal 29 is both dependent on the control signal 20, which is fed to the drive terminal of a p-channel field-effect transistor 24, and on a signal 19, which is fed to an n-channel field-effect transistor 25. A supply voltage 27 can be forwarded via the p-channel field-effect transistors 24 according to the input signal 29 and the control signal 20, whereas the potential of the ground terminal 26 can be forwarded via the n-channel field-effect transistors 25 according to the input signal 29 and the control signal 19. This forwarded signal is again fed to a stage of essentially identical construction, which generates the output signal 30 of the controllable delay device 5 (delay line). The input signal 29 is delayed or extended by a specific period of time depending on the control signals 19, 20 and controllable edges are thus generated in the output signal 30 in a controlled fashion.

FIG. 9 shows the signal profiles of a delay locked loop according to FIG. 5 with a dual delay device 5 (dual delay line). The external clock signal 1 has a shifted duty ratio (duty cycle) since the HIGH level of the clock signal is present for a different length of time than the LOW level of the clock signal. The complementary external clock signal 2 corresponds to the inverted external clock signal 1. In comparison with the external clock signal 1, a clock signal 3, which is generated on the chip and has to pass through the receiver 22a, is slightly delayed, which equally applies to the complementary clock signal 4 generated on a chip. In the locked state illustrated, the signal 21 delayed via the feedback 8 has no phase difference with respect to the clock signal 3 generated on the chip. The shift between the delayed signal 21 of the feedback and the delayed internal clock signal 11 results from the feedback delay, the shifted delayed clock signal 12 in this case having an inverted profile with respect to the delayed internal clock signal 11.

Consequently, with an apparatus according to FIG. 5, although a delayed internal clock signal 11 and a clock signal 12 complementary thereto can be generated with precisely corresponding edge instants, no correction of the duty ratio (duty cycle) can be performed if the duty ratio of the external clock signal 1 deviates from the desired value of 0.5.

The control signal of the delay device 5 (delay line) is generated in a conventional manner by locking the phase of the delayed internal clock signal 11 with the received clock signal 3 and the use of a pump device 6 in accordance with FIGS. 2 and 3 (charge pump). By virtue of the fact that both delay devices 5 (delay lines) are driven with the same control voltages 19, 20, an identical delay time results therefrom for both devices.

SUMMARY

It is an object of the present invention to provide a method for generating two signals with a pre-determined spacing between the mutually corresponding signal edges and a corresponding apparatus whereby it is possible to correct an imprecise duty ratio of an external clock signal to a precise internal clock signal with a duty ratio of, in particular, 0.5.

According to the invention, this object is achieved by means of the apparatus for generating two signals with a predetermined spacing between the mutually corresponding signal edges as specified in claim 1 and by means of the method according to claim 11.

The idea underlying the present invention consists in shifting an internal clock signal and a shifted internal clock signal with respect to one another in such a way that, in particular, the rising edges of the internal clock signal and of the shifted internal clock signal are spaced apart from one another by, in particular, half a clock period of the period duration of the input clock.

In the present invention, the problem mentioned in the introduction is solved in particular by virtue of the fact that the second delay device (delay line) is driven by an independent second pump device (charge pump) having a slightly modified pump circuit.

In accordance with one preferred development, a second device for generating a second control signal has a duty ratio detector.

In accordance with a further preferred development, the second device for generating the second control signal has a pump device by means of which the second control signal can be generated in a manner dependent on an output signal of the duty ratio detector.

In accordance with a further preferred development, the pump device has switching devices and at least one capacitance.

In accordance with a further preferred development, the switching devices have both p-channel field-effect transistors and n-channel field-effect transistors.

In accordance with a further preferred development, the output signals of the duty ratio detector are coupled only to control terminals of the n-channel field-effect transistors, these n-channel field-effect transistors being embodied in doubled (parallel) fashion, in particular.

In accordance with a further preferred development, the duty ratio detector carries out an edge detection whose output signal has a HIGH level between a rising edge of the delayed internal clock signal and a rising edge of the shifted inverted delayed internal clock signal and a LOW level between a rising edge of the shifted inverted delayed internal clock signal and a rising edge of the delayed internal clock signal.

In accordance with a further preferred development, the method uses an analog delay locked loop (DLL).

In accordance with a further preferred development, the method uses a digital, clock-controlled delay locked loop (DLL).

In accordance with a further preferred development, the method is used to generate a clock signal on a semiconductor device which has a duty ratio of 0.5.

Exemplary embodiments of the invention are illustrated in the drawings and explained in more detail in the description below.

BRIEF DESCRIPTION OF THE FIGURES

In the figures:

FIG. 6 shows the diagrammatic circuit of part of a customary pump device;

FIG. 7 shows the diagrammatic circuit of a customary current mirror of a pump device;

FIG. 8 shows the diagrammatic circuit of a delay element unit of a customary delay device.

In the figures, identical reference symbols denote identical or functionally identical constituent parts.

DETAILED DESCRIPTION

Figure 1:
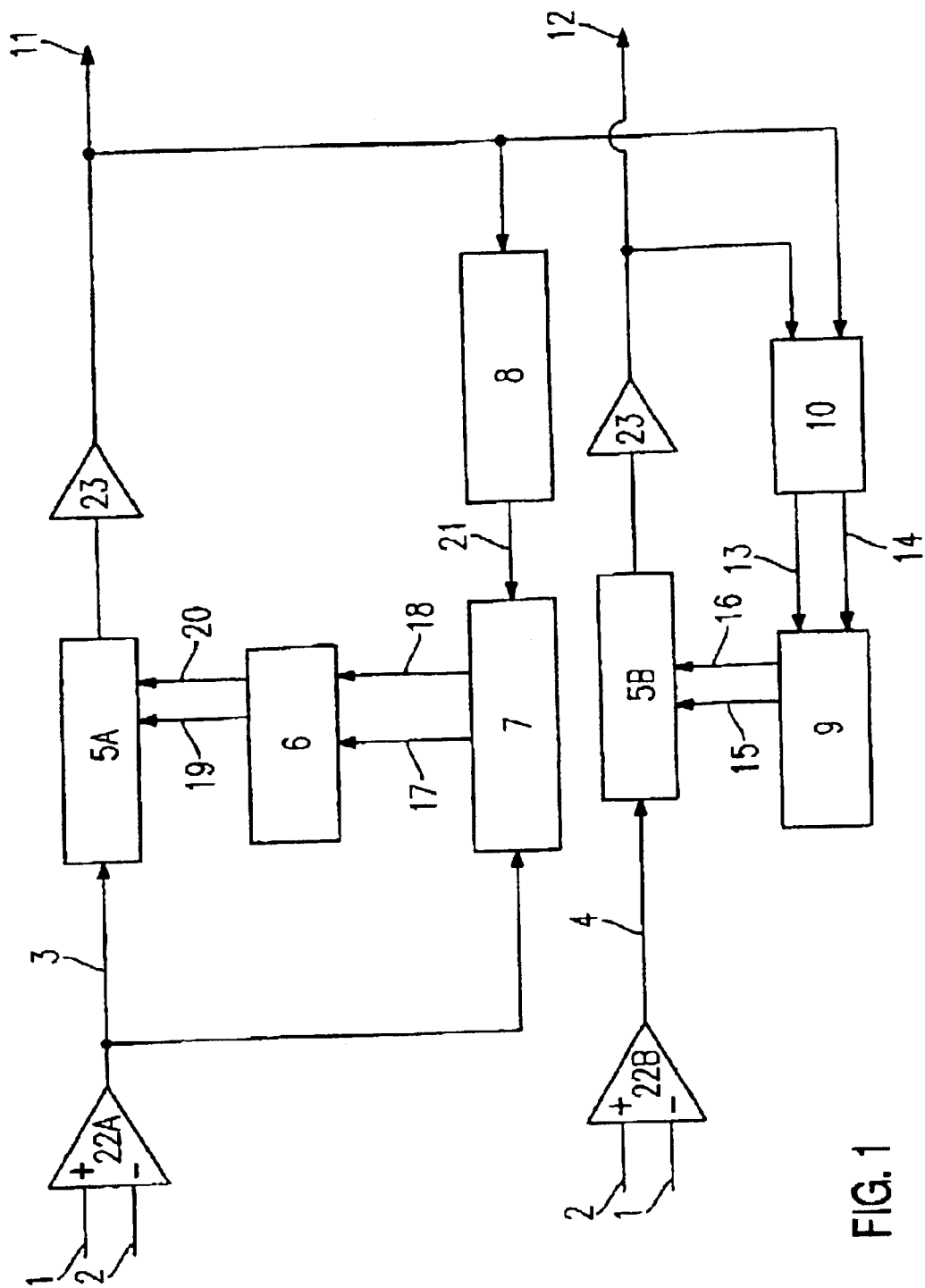
FIG. 1 shows the block diagram of an apparatus for elucidating an embodiment of the present invention.

FIG. 1 illustrates a receiver 22A, which processes an external clock signal 1 and an external clock signal 2, which is complementary thereto, to form a clock signal 3 generated on a chip, in particular. A second receiver 22B is likewise provided in this arrangement, which second receiver is connected in a complementary manner to the external input signal 1 and the complementary external clock signal 2 and, consequently, generates a complementary clock signal 4 generated on the chip, in particular. The clock signal 3 is fed to a first delay device 5A (delay line), which delays the clock signal 3 in a manner dependent on control signals 19, 20. Having been passed via a driver stage 23, a delayed internal clock signal 11 is obtained, which is delayed via a feedback 8 to give a delayed signal 21. The delayed signal 21 and the clock signal 3 generated on the chip, in particular, are compared with one another in a phase detector 7, which forwards a control signal 17, 18 to a conventional pump device 6 (charge pump). In a manner dependent on the control signals 17, 18, the pump device 6 generates the control signals 19, 20, in particular control voltages, which are fed to the first delay device 5A (delay line) for controlling the delay time period.

The complementary clock signal 4 generated on the chip, in particular, is fed to a second delay device 5B (delay line), which, in a manner dependent on a control signal 15, 16, forwards the complementary clock signal 4 in delayed fashion to a driver stage 23, which provides a shifted inverted delayed internal clock signal 12. The delayed internal clock signal 11 and the shifted inverted delayed internal clock signal 12 are fed to a duty ratio detector 10 (duty cycle detector), which outputs a control signal 13, 14 to a modified pump device 9 (modified charge pump). Any type of edge detector circuit can be used to generate the control signal 13, 14. The modified pump device 9 (modified charge pump) generates from the control signal 13, 14 a control signal 15, 16, in particular a control voltage, for controlling the delay time period of the second delay device 5B.

In the circuit, the delayed internal clock signal 11 is intentionally shifted with respect to an inverted delayed internal clock signal 12, so that the rising edges of the signals 11, 12 in each case have a spacing of half a clock period T/2 of the clock period T of the clock signal 1, 2, 3, 4 from one another. Since, by way of example, only the rising edges are utilized on a chip, this modification guarantees the correction of the duty ratio.

Figure 2:
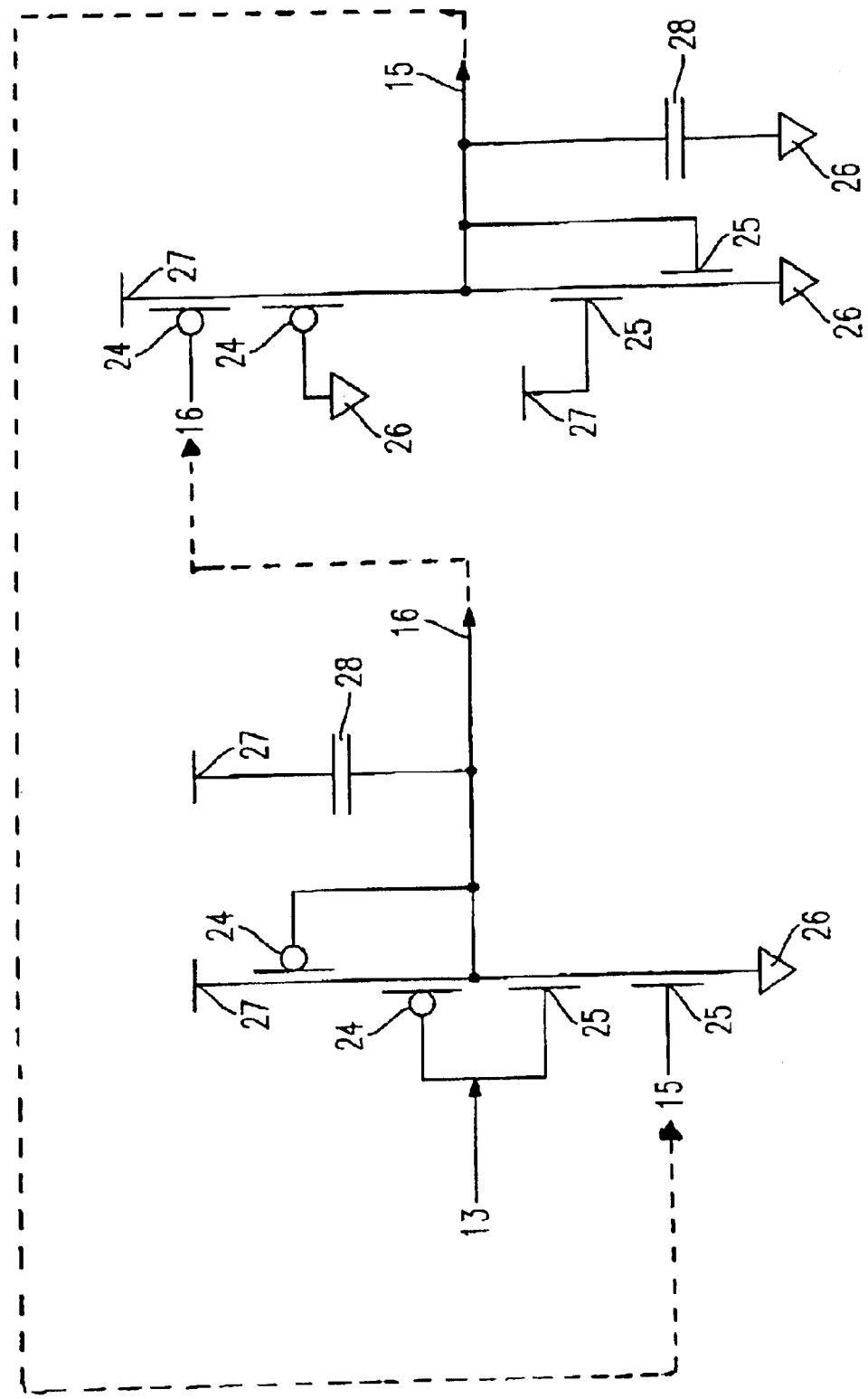
FIG. 2 shows the diagrammatic circuit of part of a first modified pump device for elucidating a detail of an embodiment of the present invention.

FIG. 2 shows the diagrammatic circuit of part of a first modified pump device for elucidating a detail of an embodiment of the present invention.

In the left-hand drawing of FIG. 2, the control signal is fed in parallel both to a drive terminal of a p-channel field-effect transistor 24 and to a control terminal of an n-channel field-effect transistor 25. Via the p-channel field-effect transistor 24 driven by the control signal 13 and a further p-channel field-effect transistor 24, to whose control terminal a control signal 16 is applied, a voltage source 27 can be connected to one terminal of a capacitor 28, whose other terminal is connected to the potential of the voltage source 27. The n-channel field-effect transistor 25 driven by means of the control signal 13 and an n-channel field-effect transistor 25 driven by means of a control signal 15 provide a connection between ground 26 and one terminal of the capacitor 28. The control signal 16 which is generated here is dependent on the charging state of the capacitor 28 or the potential difference between the terminals of the capacitor 28.

The right-hand drawing of FIG. 2 illustrates a current mirror for generating a control signal 15 from a control signal 16. Here, one terminal of the capacitor 28 is connected to ground 26 and the other terminal of the capacitor 28 can be connected to a voltage source 27 via a p-channel field-effect transistor 24 in a manner dependent on the control signal 16, as a result of which the capacitor 28 can be charged. The voltage across the capacitor 28 corresponds to the output signal 15 of the current mirror, which is fed to the drive terminal of an n-channel field-effect transistor 25 in order to be able to discharge the capacitor 28 via ground 26. A turned-on p-channel field-effect transistor 24 whose control terminal is connected to ground 26 and an n-channel field-effect transistor 25 whose control terminal is connected to the supply voltage 27 are in each case provided for balancing purposes.

The modified pump device 9 or its output signals 15, 16, i.e. its output voltages, is described by the following system of equations:

$$dV16/dT=1/C\times[(1-dc)\times I16-dc\times I15]$$

$$dV15/dt=1/C\times(I16-I15),$$

where dc denotes the duty ratio of the control signal 13, 14, i.e. the duration of the HIGH level divided by the clock period duration, and C denotes the capacitance of the capacitor 28. I16 designates the saturation current which is driven through the p-channel field-effect transistor 24 by the control voltage 16 present at the gate, and I15 denotes the saturation current which is driven through the n-channel field-effect transistor 25 by the control voltage 15 present at the gate. The left-hand and right-hand parts of the modified pump device 9 (modified charge pump) according to FIG. 2 are cross-coupled to one another.

As a result of the feedback via the duty ratio detector 10 and the modified pump device 9 according to FIG. 1, the second delay device 5B attempts to achieve a stable state. The sole stable state coincides with the solution of the above system of equations and is given for a duty ratio dc=0.5. Consequently, the second circuit, i.e. the lower circuit according to FIG. 1, corrects the duty ratio deviation of the external clock signal 1 to give an identical spacing between the rising edge of the delayed internal clock signal 11 and of the shifted inverted delayed internal clock signal 12.

The realization of a modified pump device 9 according to FIG. 2 may suffer from the disadvantage that both a p-channel and an n-channel field-effect transistor 24, 25 have to be switched with the clock frequency. Differences in the switching time of the switching devices 24, 25 may lead to a small deviation from the desired ideal behavior of an equally fast switching time.

Figure 3:
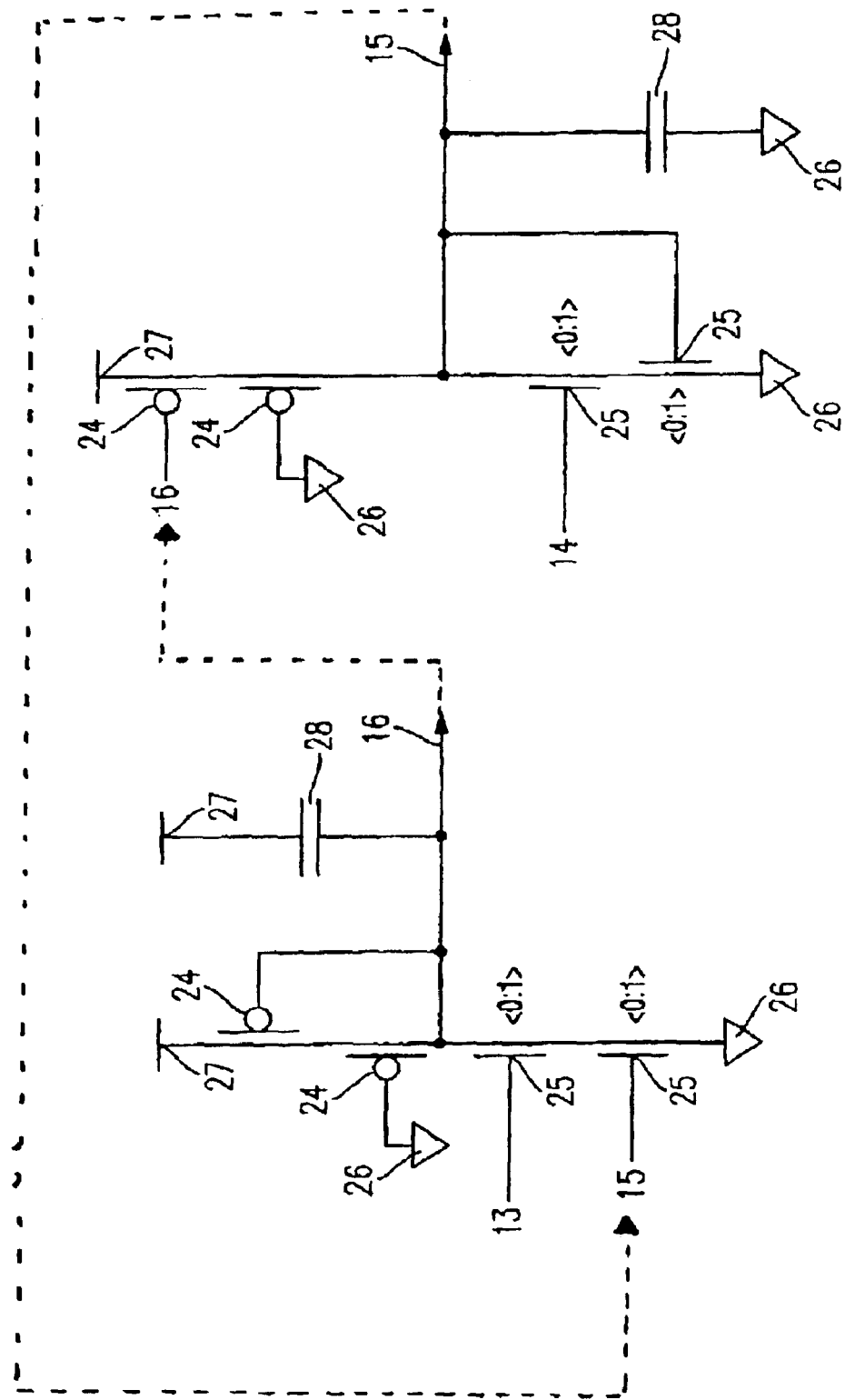
FIG. 3 shows the diagrammatic circuit of part of a second modified pump device for elucidating a detail of an embodiment of the present invention.

FIG. 3 shows the diagrammatic circuit of part of a second modified pump device for elucidating a detail of an embodiment of the present invention.

In order to avoid the disadvantage set forth with reference to FIG. 2, FIG. 3 illustrates an alternative pump device 9, which has only switching n-channel field-effect transistors $25_{<0:1>}$. A control signal 13 is fed to the drive terminal of an n-channel field-effect transistor $25_{<0:1>}$, which, together with an n-channel field-effect transistor $25_{<0:1>}$, driven by a control signal 15, can connect one terminal of a capacitor 28 to ground 26, the other terminal of the capacitor having the potential of a supply voltage 27. The output signal 16 of this left-hand part of FIG. 3 is proportional to the voltage across the capacitor 28, which is charged or discharged according to the control signals 13, 15.

The right-hand part of the diagrammatic circuit according to FIG. 3 provides a control signal 15 in a manner dependent on the signal 14 and the signal 16, which control signal is likewise dependent on the voltage across the capacitor 28.

Preferably, all the switching devices indexed with <0:1> are embodied in doubled fashion and are in each case connected in parallel. This dimensioning guarantees that the operating point of the two delay devices 5 (delay lines) is identical if the external clock signal 1 should have an ideal duty ratio of 0.5. The p-channel field-effect transistor 24 in a cascade arrangement is not absolutely necessary, but can be used to switch off the current path in the case of a reset.

The reason for the doubling of the switching devices indexed with <0:1> becomes apparent from the following system of equations:

$$dV16/dT=1/C\times[I16-dc\times 2\times I15]$$

$$dV15/dt=1/C\times[I16-(1-dc)\times 2\times I15),$$

where the designations set forth with reference to FIG. 2 are likewise valid. Here, the solution for achieving a stable state is once again a duty ratio of dc=0.5. The doubling of the switching devices 25 indexed with <0:1>, thereby giving rise to the factor 2 in the term with I15, achieves the condition I16=I15 in the stable state. Consequently, both delay devices 5A, 5B are operated at the same operating point even if the external clock signal 1 has a perfect duty ratio of 50%, since I16=I15=I20=I19 holds true here.

Figure 4:
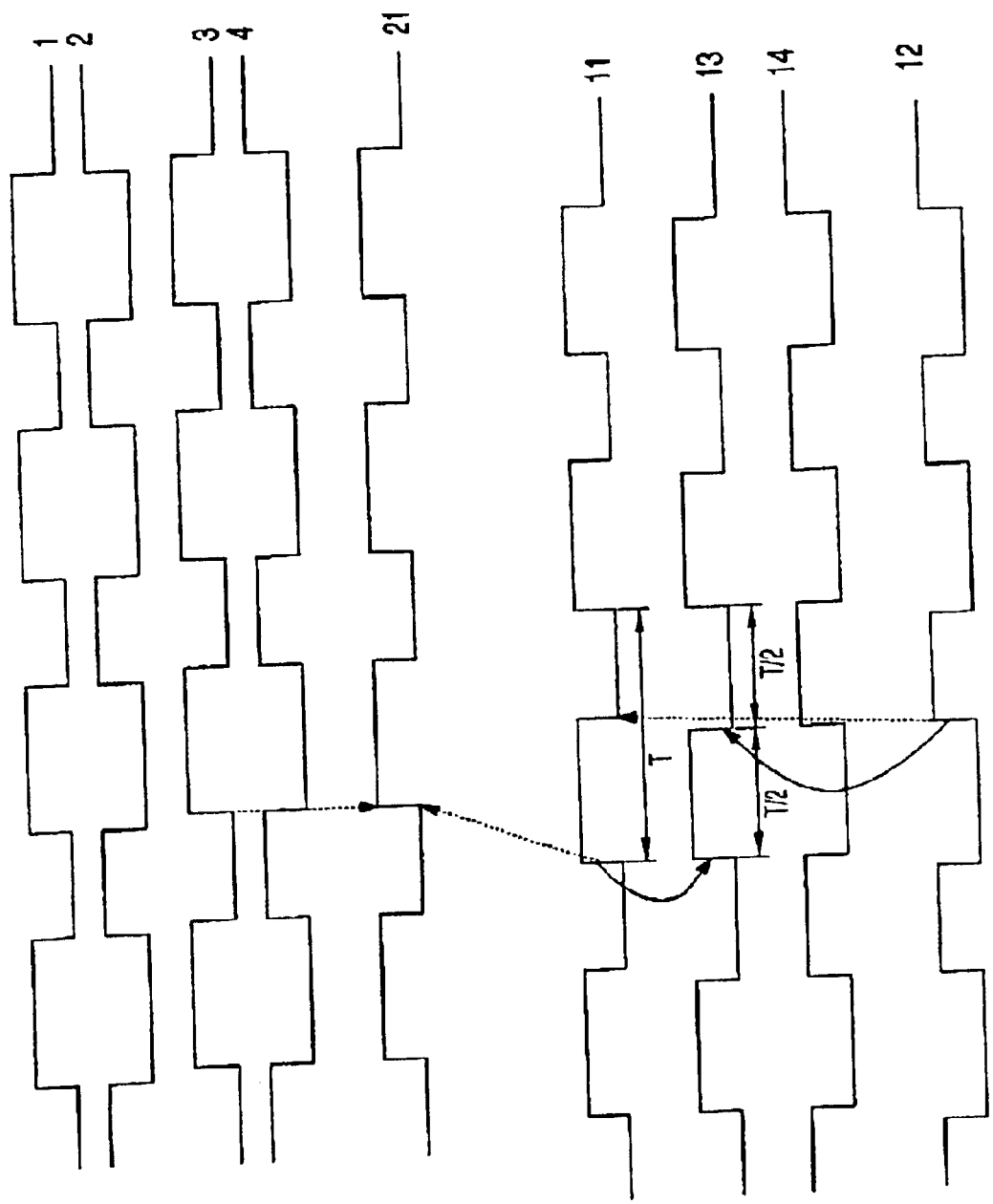
FIG. 4 shows a signal chart for elucidating the function of an embodiment of the present invention.
Figure 5:
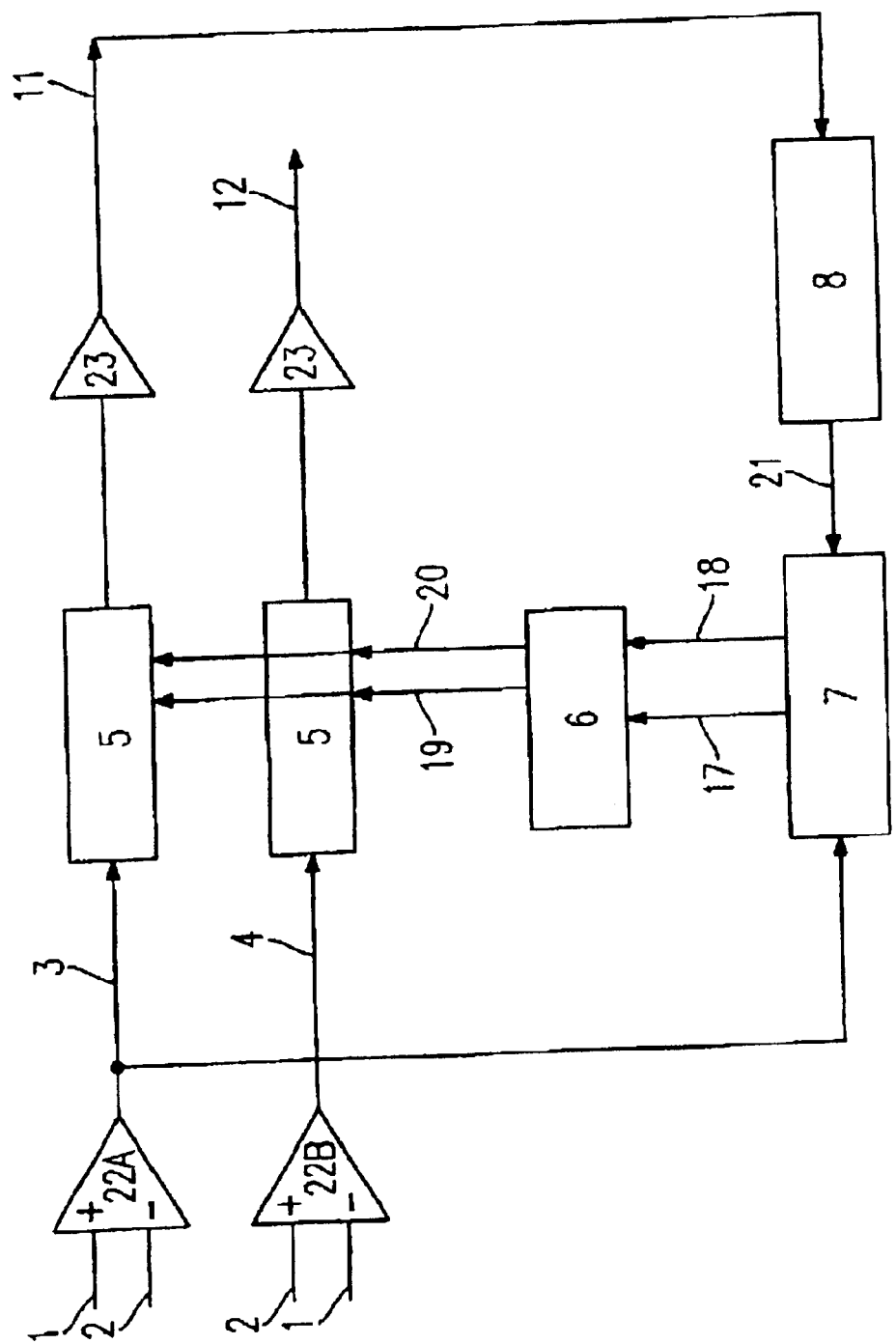
FIG. 5 shows the block diagram of a DLL circuit with dual delay device for elucidating a conventional circuit.

FIG. 4 shows a signal chart for elucidating the method of operation of the apparatus according to FIG. 1.

Figure 9:
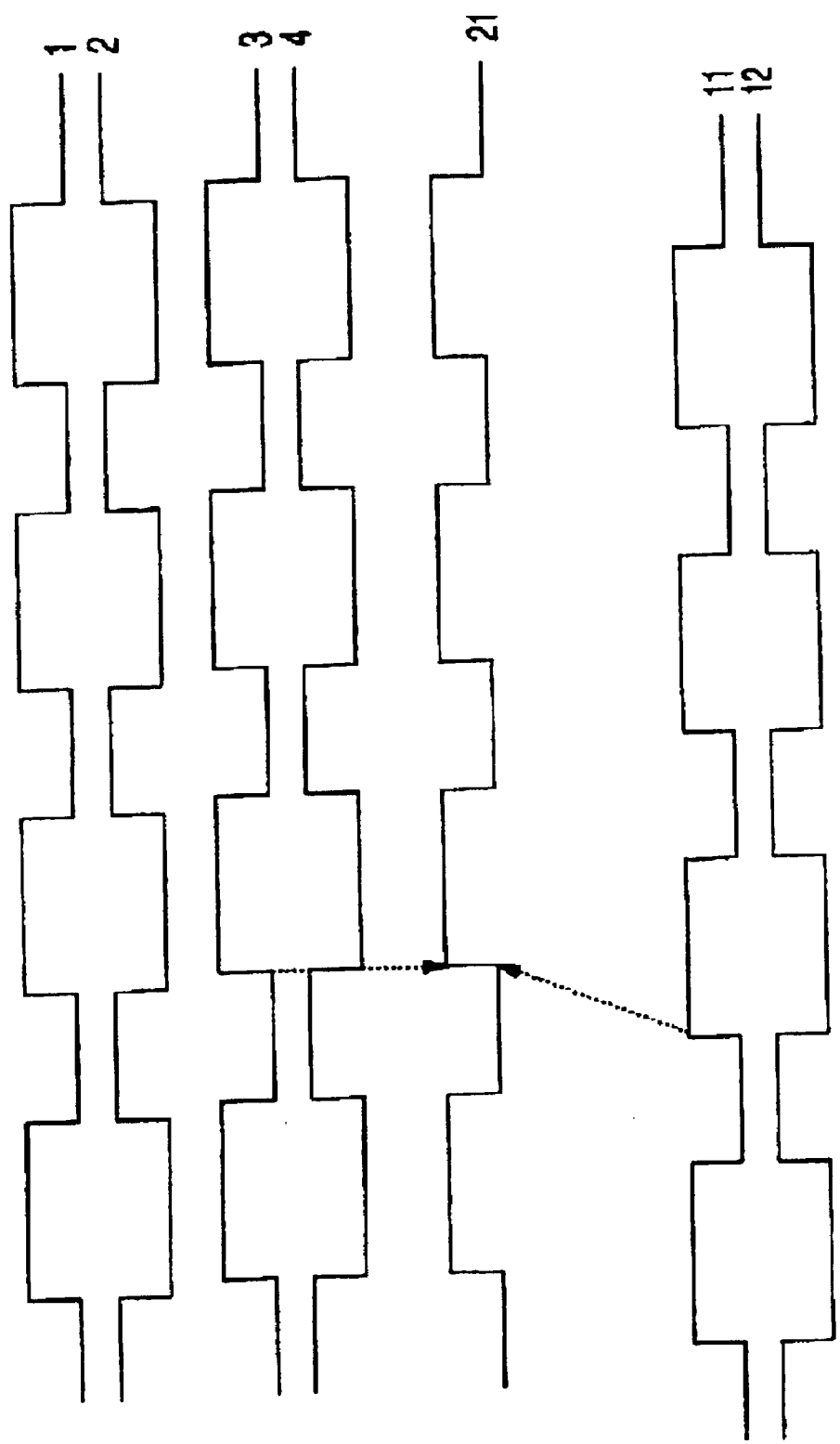
FIG. 9 shows the signal chart of a conventional DLL circuit according to FIG. 5 for elucidating the function of this circuit.

The explanation given with reference to FIG. 9 applies to the charts of the signals 1, 2, 3, 4, 21, 11. The control signal 13 has a HIGH level between the rising edge of the delayed internal clock signal 11 and the rising edge of the shifted inverted delayed internal clock signal 12 and a LOW level between the rising edge of the shifted inverted delayed internal clock signal 12 and the rising edge of the delayed internal clock signal 11. It emerges from this that the signal 13 and the signal 14 complementary thereto in each case have, during half a period width T/2 a HIGH level and a LOW level and, consequently, a duty ratio of 0.5. In contrast to the chart according to FIG. 9, here the shifted inverted delayed internal clock signal 12 is not complementary to the delayed internal clock signal 11, but rather shifted slightly with respect to a complementary delayed internal clock signal (not illustrated).

The present invention provides an apparatus and a method which realizes the correction of a duty ratio (duty cycle) using comparatively simple means and without a large current consumption.

Although the present invention has been described above using preferred exemplary embodiments, it is not restricted thereto, but rather can be modified in diverse ways. Even though the above examples relate to a circuit for an analog delay locked loop, the use of the same principle can likewise be realized in a digital, i.e. clock-controlled, delay locked loop.

Moreover, the invention is not restricted to the application possibilities mentioned.

What is claimed is:

1. An apparatus comprising:
 a first delay device for delaying a clock signal in response to a first control signal, thereby producing a delayed clock signal;
 a first control signal generator configured to generate the first control signal on the basis of the clock signal and the delayed clock signal;
 a second delay device for delaying a complementary clock signal in response to a second control signal, thereby producing a delayed complementary clock signal; and
 a second control signal generator for generating the second control signal on the basis of the delayed clock signal and the delayed complementary clock signal, the second control signal generator being configured to cause the delayed clock signal and the delayed complementary clock signal to have a steady-state condition in which mutually corresponding edges thereof are separated by a pre-determined spacing.

2. The apparatus of claim 1, wherein the second control signal generator is configured to cause the pre-determined spacing to be half of a period of the clock signal.

3. The apparatus of claim 1, further comprising:
 a first signal generator in communication with the first delay device and the first control signal generator, the first signal generator being configured to generate the clock signal in response to an external clock signal generated external to the apparatus, and
 a second signal generator in communication with the second delay device, the second signal generator being configured to generate the complementary clock signal in response to an external complementary clock signal generated external to the apparatus.

4. The apparatus of claim 1, wherein the first control signal generator comprises:
 a phase detector configured to generate a phase signal indicative of a phase difference between the clock signal and the delayed clock signal; and
 a charge pump for generating the first control signal in response to the phase signal.

5. The apparatus of claim 1, wherein the second control signal generator comprises a duty ratio detector disposed to receive the delayed clock signal and the delayed complementary clock signal.

6. The apparatus of claim 5, wherein the second control signal generator further comprises a charge pump configured to generate the second control signal on the basis of the output of the duty ratio detector.

7. The apparatus of claim 6, wherein the charge pump comprises first and second switches controlled by an output of the duty ratio detector.

8. The apparatus of claim 7, wherein the charge pump further comprises a capacitor configured to store a charge that depends on states of the first and second switches.

9. The apparatus of claim 6, wherein the charge pump comprises:
 first and second switches controlled by an output of the duty ratio detector; and
 a capacitor configured to store a charge that depends on states of the first and second switches.

10. The apparatus of claim 7, wherein the first switch comprises a p-channel field-effect transistor and the second switch comprises an n-channel field-effect transistor.

11. The apparatus of claim 7, wherein the first and second switches comprise n-channel field-effect transistors.

12. The apparatus of claim 7, wherein the first and second switches comprise p-channel field-effect transistors.

13. The apparatus of claim 11, wherein the output of the duty cycle detector is configured to connect only to control terminals of the n-channel field-effect transistors, and wherein the first and second switches are configured such that the first and second delay devices impose the same delay when an external clock signal provided to the apparatus has a duty cycle of 0.5.

14. A method comprising:
 delaying a clock signal in response to a first control signal, thereby generating a delayed clock signal therefrom;
 generating a first control signal on the basis of the clock signal and the delayed clock signal;
 delaying a complementary clock signal in response to a second control signal, thereby generating a delayed complementary clock signal therefrom;
 generating a second control signal on the basis of the delayed clock signal and the delayed complementary clock signal, the second control signal being selected to cause the delayed clock signal and the delayed complementary clock signal to have a steady-state condition in which mutually corresponding edges thereof are separated by a pre-determined spacing.

15. The method of claim 14, further comprising selecting the pre-determined spacing pre-determined spacing to be half of a period of the clock signal.

16. The method of claim 14, wherein:
 delaying a clock signal comprises delaying a clock signal derived from an externally generated clock signal, and
 delaying a complementary clock signal comprises delaying a complementary clock signal from an externally generated complementary clock signal.

17. The method of claim 14, wherein generating a second control signal comprises determining a duty ratio of the delayed clock signal and the delayed complementary clock signal, and selecting the second control signal on the basis of the duty ratio.

18. The method of claim 17, wherein determining a duty ratio comprises providing an output signal that is at a first level at intervals between a rising edge of the delayed clock signal and a rising edge of the delayed complementary clock signal, and that is at a second level at intervals between a rising edge of the delayed complementary clock signal and a rising edge of the delayed clock signal.

19. The method of claim 14, further comprising providing an analog delay-locked loop.

20. The method of claim 14, further comprising providing a digital delay-locked loop.

21. An apparatus for generating a first signal and a second signal separated from the first signal by a selected interval, the apparatus comprising:

a first delay device for delaying a clock signal by an interval controlled by a first control signal, thereby producing a delayed clock signal;

a second delay device for delaying a complementary clock signal by an interval controlled by a second control signal, thereby producing a delayed complementary clock signal;

a first control signal generator disposed to receive the clock signal and the delayed clock signal, the first control signal generator being configured to generate the first control signal on the basis of a phase difference between the clock signal and the delayed clock signal;

a second control signal generator disposed to receive the delayed clock signal and the delayed complementary clock signal, the second control signal generator including means for generating the second control signal on the basis of a phase difference between the delayed clock signal and the delayed complementary clock signal.

* * * * *

UNITED STATES PATENT AND TRADEMARK OFFICE
CERTIFICATE OF CORRECTION

PATENT NO. : 6,765,421 B2
DATED : July 20, 2004
INVENTOR(S) : Martin Brox and Alessandro Minzoni It is certified that error appears in the above-identified patent and that said Letters Patent is hereby corrected as shown below:

<u>Title page,</u>
Insert Item:
-- [30] Foreign Application Priority Data
  March 28, 2002 (DE) ……. 10214304.8 --

Signed and Sealed this

Eighteenth Day of January, 2005

JON W. DUDAS
*Director of the United States Patent and Trademark Office*